US008653657B2

(12) United States Patent
Miyata et al.

(10) Patent No.: US 8,653,657 B2
(45) Date of Patent: Feb. 18, 2014

(54) SEMICONDUCTOR CHIP, METHOD OF MANUFACTURING SEMICONDUCTOR CHIP, AND SEMICONDUCTOR DEVICE

(75) Inventors: Osamu Miyata, Kyoto (JP); Tadahiro Morifuji, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1004 days.

(21) Appl. No.: 11/990,875

(22) PCT Filed: Aug. 18, 2006

(86) PCT No.: PCT/JP2006/316264
§ 371 (c)(1),
(2), (4) Date: Feb. 22, 2008

(87) PCT Pub. No.: WO2007/023747
PCT Pub. Date: Mar. 1, 2007

(65) Prior Publication Data
US 2009/0127705 A1    May 21, 2009

(30) Foreign Application Priority Data

Aug. 23, 2005 (JP) .................................. 2005-241520
Aug. 23, 2005 (JP) .................................. 2005-241521

(51) Int. Cl.
*H01L 29/40*    (2006.01)
(52) U.S. Cl.
USPC ............ 257/737; 257/E23.068; 257/E21.589; 257/772; 257/781; 438/106; 438/132; 438/612; 438/613
(58) Field of Classification Search
USPC ......... 438/612, 613, 106–132, 754, 692, 633, 438/637, 669; 257/737, E23.068, E21.589, 257/738, 772, 781, 686, 734
See application file for complete search history.

(56) References Cited

U.S. PATENT DOCUMENTS

| | | | | |
|---|---|---|---|---|
| 5,072,331 A | * | 12/1991 | Thiele et al. | 361/767 |
| 5,186,383 A | * | 2/1993 | Melton et al. | 228/180.22 |
| 5,290,732 A | * | 3/1994 | Kumar et al. | 216/13 |
| 5,367,765 A | * | 11/1994 | Kusaka | 29/840 |
| 5,465,152 A | * | 11/1995 | Bilodeau et al. | 356/602 |
| 5,550,427 A | * | 8/1996 | Hayashi | 313/355 |
| 5,828,128 A | * | 10/1998 | Higashiguchi et al. | 257/738 |
| 5,889,326 A | * | 3/1999 | Tanaka | 257/737 |
| 5,894,165 A | * | 4/1999 | Ma et al. | 257/666 |
| 5,956,606 A | * | 9/1999 | Burnette | 438/615 |

(Continued)

FOREIGN PATENT DOCUMENTS

| | | |
|---|---|---|
| JP | 8-153747 | 6/1996 |
| JP | 9-181124 | 7/1997 |

(Continued)

*Primary Examiner* — Alexander Sofocleous
*Assistant Examiner* — Ankush Singal
(74) *Attorney, Agent, or Firm* — Rabin & Berdo, P.C.

(57) ABSTRACT

There are provided a semiconductor device capable of accurately determining whether a semiconductor chip is bonded to a solid-state device such as the other semiconductor chip parallelly with each other, a semiconductor chip used for the semiconductor device, and a method of manufacturing the semiconductor chip. The semiconductor chip includes a functional bump projected with a first projection amount from the surface of the semiconductor chip and electrically connecting the semiconductor chip to the solid-state device, and a connection confirmation bump projected with a second projection amount, which is smaller than the first projection amount, from the surface of the semiconductor chip and used for confirming the state of the electrical connection by the functional bump.

23 Claims, 5 Drawing Sheets

(a)

(b)

(56) References Cited

U.S. PATENT DOCUMENTS

| | | | |
|---|---|---|---|
| 6,437,439 B1* | 8/2002 | Shimoe | 257/734 |
| 6,452,281 B1* | 9/2002 | Kanda | 257/780 |
| 6,462,420 B2* | 10/2002 | Hikita et al. | 257/777 |
| 6,580,169 B2* | 6/2003 | Sakuyama et al. | 257/738 |
| 6,657,312 B2* | 12/2003 | Hirano | 257/780 |
| 6,702,652 B2* | 3/2004 | Arai | 451/41 |
| 6,707,159 B1* | 3/2004 | Kumamoto et al. | 257/778 |
| 6,849,944 B2* | 2/2005 | Murtuza et al. | 257/734 |
| 6,870,270 B2* | 3/2005 | Kobrinsky et al. | 257/777 |
| 6,921,716 B2* | 7/2005 | Huang et al. | 438/613 |
| 7,042,088 B2* | 5/2006 | Ho | 257/738 |
| 7,045,900 B2* | 5/2006 | Hikita et al. | 257/777 |
| 7,300,865 B2* | 11/2007 | Hsieh et al. | 438/612 |
| 7,348,217 B2* | 3/2008 | Kobrinsky et al. | 438/108 |
| 7,514,788 B2* | 4/2009 | Kobae et al. | 257/738 |
| 7,714,452 B2* | 5/2010 | Clevenger et al. | 257/786 |
| 2001/0015495 A1* | 8/2001 | Brofman et al. | 257/734 |
| 2001/0023993 A1* | 9/2001 | Kawashima | 257/780 |
| 2002/0068381 A1* | 6/2002 | Ference et al. | 438/108 |
| 2002/0079577 A1* | 6/2002 | Ho | 257/737 |
| 2002/0130414 A1* | 9/2002 | Hirano | 257/750 |
| 2002/0151228 A1* | 10/2002 | Kweon et al. | 439/887 |
| 2003/0062611 A1* | 4/2003 | Shibata | 257/686 |
| 2003/0067072 A1* | 4/2003 | Ono et al. | 257/737 |
| 2003/0075791 A1 | 4/2003 | Shibata | |
| 2003/0214038 A1* | 11/2003 | Nemoto | 257/738 |
| 2004/0104476 A1* | 6/2004 | Iwamoto | 257/737 |
| 2004/0106232 A1* | 6/2004 | Sakuyama et al. | 438/108 |
| 2004/0140561 A1* | 7/2004 | Suzuki | 257/737 |
| 2004/0201096 A1* | 10/2004 | Iijima et al. | 257/734 |
| 2005/0062151 A1* | 3/2005 | Nagao | 257/734 |
| 2005/0110161 A1* | 5/2005 | Naito et al. | 257/778 |
| 2005/0116340 A1* | 6/2005 | Shindo | 257/737 |
| 2005/0146838 A1* | 7/2005 | Shioga et al. | 361/306.3 |
| 2005/0212134 A1* | 9/2005 | Pu | 257/738 |
| 2005/0269714 A1* | 12/2005 | Akram et al. | 257/778 |
| 2006/0012038 A1* | 1/2006 | Miyazaki et al. | 257/737 |
| 2006/0094157 A1* | 5/2006 | Kobae et al. | 438/106 |
| 2006/0177965 A1* | 8/2006 | Senda | 438/108 |
| 2006/0249859 A1* | 11/2006 | Eiles et al. | 257/797 |
| 2009/0127705 A1* | 5/2009 | Miyata et al. | 257/737 |

FOREIGN PATENT DOCUMENTS

| | | |
|---|---|---|
| JP | 2003-133508 | 5/2003 |
| JP | 2003-142649 | 5/2003 |
| JP | 2004-228202 | 8/2004 |

* cited by examiner

FIG. 5
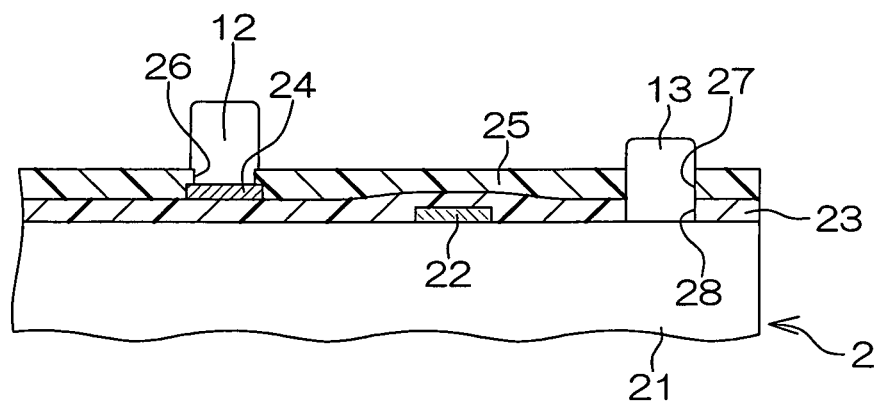
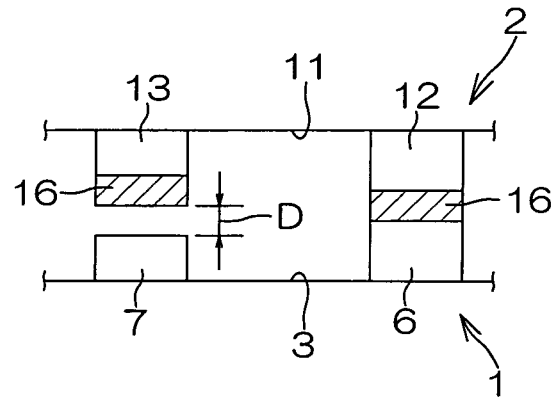
FIG. 6 (a)
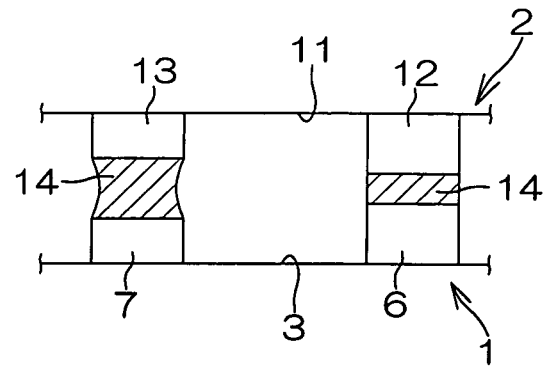
FIG. 6 (b)

SEMICONDUCTOR CHIP, METHOD OF MANUFACTURING SEMICONDUCTOR CHIP, AND SEMICONDUCTOR DEVICE

TECHNICAL FIELD

The present invention relates to a semiconductor device having a chip-on-chip structure or a flip chip bonding structure as well as a semiconductor chip applied to this semiconductor device and a method of manufacturing the same.

BACKGROUND ART

A chip-on-chip structure obtained by opposing and bonding the surface of a semiconductor chip to the surface of another semiconductor chip, for example, is known as a structure for attaining downsizing and improvement in integration of a semiconductor device.

In the semiconductor device of the chip-on-chip structure, large numbers of functional bumps and connection confirmation bumps are provided on the surface of each semiconductor chip. On the surface of each semiconductor chip, for example, a large number of functional bumps are arranged at the center thereof in the form of a lattice, and connection confirmation bumps are arranged on the four corners.

In each semiconductor chip, all functional bumps are formed with the same height (projection amount from the surface of the semiconductor chip) with a metallic material such as copper (Cu). The tip end of each functional bump of one semiconductor chip is provided with a solder bond alloyable with the material of the functional bump. Each functional bump of the one semiconductor chip and each functional bump of the other semiconductor chip are connected with each other through this solder bond, thereby attaining electrical and mechanical connection between the semiconductor chips.

On the other hand, the connection confirmation bumps are formed at the same height (projection amount from the surface of the semiconductor chip) as the functional bumps with the same metallic material as the functional bumps in each semiconductor chip. The tip end of each connection confirmation bump of the one semiconductor chip is provided with a solder bond. When both the semiconductor chips are parallelly bonded to each other, therefore, each connection confirmation bump of the one semiconductor chip and each connection confirmation bump of the other semiconductor chip are connected with each other through the solder bond. Therefore, whether or not both the semiconductor chips are parallelly connected with each other can be determined by checking the connection state between these corresponding connection confirmation bumps. In other words, both the semiconductor chips can be determined as parallelly bonded to each other if the connection states between all corresponding connection confirmation bumps are excellent. If even one of the connection states between the corresponding connection confirmation bumps is defective, on the other hand, both the semiconductor chips can be determined as not parallelly bonded to each other (the one semiconductor chip is bonded to the other semiconductor chip in an inclined manner).

Patent Document 1: Japanese Unexamined Patent Publication No. 08-153747

DISCLOSURE OF THE INVENTION

Problems to be Solved by the Invention

In the conventional structure, however, the solder bonds provided on the tip ends of the connection confirmation bumps may be melted and expanded in heat treatment to disadvantageously connect all corresponding connection confirmation bumps of the semiconductor chips with each other even if the one semiconductor chip is bonded to the other semiconductor chip in a slightly inclined state. In this case, both the semiconductor chips are determined as parallelly bonded to each other although the one semiconductor chip is bonded to the other semiconductor chip in the inclined state.

Accordingly, an object of the present invention is to provide a semiconductor device and a semiconductor chip employed therefor and a method of manufacturing the same, allowing an accurate determination as to whether or not the semiconductor chip is parallelly bonded to a solid-state device such as another semiconductor chip.

Means for Solving the Problems

The semiconductor chip according to the present invention for attaining the object is a semiconductor chip bonded to a solid-state device in a state of opposing the surface thereof to the solid-state device, including: a functional bump projected from the surface with a first projection amount for electrically connecting the semiconductor chip with the solid-state device; and a connection confirmation bump projected from the surface with a second projection amount smaller than the first projection amount and used for confirming the state of the electrical connection by the functional bump.

According to this structure, the connection confirmation bump is formed lower than the functional bump, whereby a wide clearance is formed between the portion (a pad or a bump arranged on the surface of the solid-state device, for example) of the solid-state device connected with the connection confirmation bump and the tip end of the connection confirmation bump on a portion where the solid-state device and the surface of the semiconductor chip are spaced widely if the surface of the semiconductor chip is even slightly inclined with respect to the solid-state device. Even if a bond formed on the connection confirmation bump is expanded when the connection confirmation bump and the solid-state device are bonded to each other through the bond, therefore, the bond does not reach the solid-state device, and the connection between the connection confirmation bump and the solid-state device is not attained. Therefore, whether or not the semiconductor chip is parallelly bonded to the solid-state device can be accurately determined on the basis of the connection state between the connection confirmation bump and the solid-state device.

The semiconductor chip may further include a semiconductor substrate, a surface protective film covering the surface of the semiconductor substrate, and an electrode pad interposed between the semiconductor substrate and the surface protective film and arranged to face a pad opening formed in the surface protective film. In this case, the functional bump is provided on the electrode pad and projected from the surface protective film with the first projection amount through the pad opening, and the connection confirmation bump heaps up on a position which is closer to the semiconductor substrate more than a position of the electrode pad is, and projected from the surface protective film with the second projection amount smaller than the first projection amount through a through-hole penetratingly formed in the surface protective film.

The semiconductor chip having this structure can be manufactured by a method including the steps of forming a surface protective film on the surface of a semiconductor substrate, forming in the surface protective film a pad opening exposing an electrode pad arranged on the semiconductor substrate and a through-hole penetrating the surface protective film, and forming a functional bump penetrating the pad opening and a connection confirmation bump penetrating the through-hole.

The semiconductor chip may further include an interlayer film which is interposed between the semiconductor substrate and the surface protective film and in which the electrode pad is arranged on the surface thereof, and the connection confirmation bump may heap up on the surface of the interlayer film.

Alternatively, the connection confirmation bump may heap up on the surface of the semiconductor substrate.

The semiconductor device according to the present invention for attaining the above object is a semiconductor device having a chip-on-chip structure obtained by bonding a first semiconductor chip and a second semiconductor chip to each other in a state of opposing the surface of the second semiconductor chip to the surface of the first semiconductor chip, including: a first semiconductor chip side functional bump projected from the surface of the first semiconductor chip; a first semiconductor chip side connection confirmation bump projected from the surface of the first semiconductor chip; a second semiconductor chip side functional bump projected from the surface of the second semiconductor chip with a first projection amount and connected to the first semiconductor chip side functional bump for attaining electrical connection between the first semiconductor chip and the second semiconductor chip; and a second semiconductor chip side connection confirmation bump projected from the surface of the second semiconductor chip with a second projection amount smaller than the first projection amount, connected to the first semiconductor chip side connection confirmation bump, and used for confirming the state of the electrical connection between the first semiconductor chip and the second semiconductor chip.

According to this structure, the second semiconductor chip side connection confirmation bump is formed lower than the second semiconductor chip side functional bump, whereby a wide clearance is formed between the first semiconductor chip side connection confirmation bump and the second semiconductor chip side connection confirmation bump opposed to each other on a portion where the surface of the first semiconductor chip and the surface of the second semiconductor chip are spaced widely if the surface of the second semiconductor chip is even slightly inclined with respect to the surface of the first semiconductor chip. Even if a bond formed on one of the connection confirmation bumps is expanded when these connection confirmation bumps are bonded to each other through the bond, therefore, the bond does not reach the other connection confirmation bump, and the connection between the first semiconductor chip side connection confirmation bump and the second semiconductor chip side connection confirmation bump is not attained. Therefore, whether or not the second semiconductor chip is parallelly bonded to the first semiconductor chip can be accurately determined on the basis of the connection state between the first semiconductor chip side connection confirmation bump and the second semiconductor chip side connection confirmation bump.

The first semiconductor chip side functional bump, the second semiconductor chip side functional bump, the first semiconductor chip side connection confirmation bump and the second semiconductor chip side connection confirmation bump may be made of the same metallic material. The semiconductor device may further include connecting metal layers interposed between the first semiconductor chip side functional bump and the second semiconductor chip side functional bump and between the first semiconductor chip side connection confirmation bump and the second semiconductor chip side connection confirmation bump respectively and alloyed with the metallic material for attaining the connection therebetween.

For example, the first semiconductor chip side functional bump, the second semiconductor chip side functional bump, the first semiconductor chip side connection confirmation bump and the second semiconductor chip side connection confirmation bump may be made of copper or gold. In this case, the connecting metal layers may be formed by solder bonds provided on the top surfaces of the first semiconductor chip side functional bump and the first semiconductor chip side connection confirmation bump and/or the second semiconductor chip side functional bump and the second semiconductor chip side connection confirmation bump.

The second semiconductor chip has a generally rectangular shape when the surface thereof is vertically viewed, the second semiconductor chip side functional bump is arranged at the center of the surface of the second semiconductor chip, and the second semiconductor chip side connection confirmation bump is arranged on each corner of the surface of the second semiconductor chip.

According to this structure, the second semiconductor chip side connection confirmation bump is arranged on each corner of the surface of the second semiconductor chip. If the surface of the second semiconductor chip is inclined with respect to the surface of the first semiconductor chip, therefore, a wide clearance is formed between at least a set of the first semiconductor chip side connection confirmation bump and the second semiconductor chip side connection confirmation bump. Therefore, whether or not the second semiconductor chip is parallelly bonded to the first semiconductor chip can be more accurately determined on the basis of the connection state between the first semiconductor chip side connection confirmation bump and the second semiconductor chip side connection confirmation bump.

The second semiconductor chip side connection confirmation bump may be formed lower than the second semiconductor chip side functional bump, and the first semiconductor chip side connection confirmation bump may be formed lower than the first semiconductor chip side functional bump. In other words, the first semiconductor chip side connection confirmation bump may be projected from the surface of the first semiconductor chip with a projection amount smaller than the projection amount of the first semiconductor chip side functional bump from the surface of the first semiconductor chip.

The foregoing and other objects, features and effects of the present invention will become more apparent from the following detailed description of the embodiments with reference to the attached drawings.

BRIEF DESCRIPTION OF THE DRAWINGS

FIG. 5 A schematic sectional view showing another structure of the mounted chip (a state where a connection confirmation bump heaps up on the surface of a semiconductor substrate).

FIG. 6 Schematic sectional views for illustrating a modification (such a mode that the connection confirmation bump is formed lower than the functional bump also in the base chip) of the present invention, (a) shows a state where the solder bond provided on the tip end of the functional bump of the mounted chip is in contact with the top surface of the functional bump of the base chip, and (b) shows a state where bonding between the base chip and the mounted chip is completed.

BEST MODE FOR CARRYING OUT THE INVENTION

Embodiments of the present invention are now described in detail with reference to the accompanying drawings.

Figure 1:
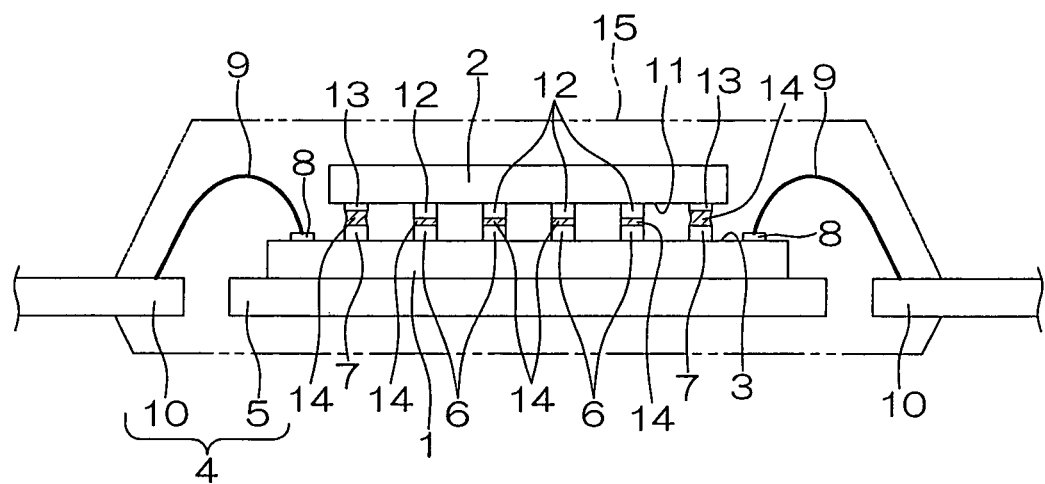
FIG. 1 A schematic sectional view showing the structure of a semiconductor device according to an embodiment of the present invention.

FIG. 1 is a schematic sectional view showing the structure of a semiconductor device according to an embodiment of the present invention.

This semiconductor device has a chip-on-chip structure obtained by superposing and bonding a base chip 1 as a solid-state device and a mounted chip 2 as a semiconductor chip with and to each other.

The base chip 1 is generally in the form of a rectangle in plan view, and die-bonded to an island 5 of a lead frame 4 in a face-up posture directing its surface (the surface of a surface protective film covering an active region side surface provided with a device in a semiconductor substrate forming the base of the base chip 1) 3 upward. A generally rectangular chip bonding region to which the mounted chip 2 is bonded is set at the center of the surface 3 of this base chip 1. A plurality of functional bumps 6 are formed in the chip bonding region in a projected (heaping-up) manner. Connection confirmation bumps 7 are formed in a projected manner on the respective corners in the chip bonding region. On the surface 3 of the base chip 1, further, a plurality of external connection pads 8 are provided on the periphery enclosing the chip bonding region. These external connection pads 8 are electrically connected (wire-bonded) to a lead portion 10 of the lead frame 4 through bonding wires 9.

The mounted chip 2 is generally in the form of a rectangle smaller than the base chip 1 in plan view, and bonded to the chip bonding region of the surface 3 of the base chip 1 in a face-down posture directing its surface (the surface of a surface protective film 25 described later) 11 downward. Functional bumps 12 connected with the functional bumps 6 of the base chip 1 respectively are formed on the surface 11 of this mounted chip 2 in a projected manner. Connection confirmation bumps 13 connected with the connection confirmation bumps 7 of the base chip 1 respectively are formed in a projected manner on the respective corners of the surface 11 of the mounted chip 2.

In the state where the base chip 1 and the mounted chip 2 are bonded to each other, the functional bumps 6 and the connection confirmation bumps 7 of the base chip 1 and the functional bumps 12 and the connection confirmation bumps 13 of the mounted chip 2 corresponding to these bumps 6 and 7 respectively are opposed to each other while butting the top surfaces thereof against each other, and connected to each other through connecting metal layers 14 interposed therebetween. Thus, the base chip 1 and the mounted chip 2 are electrically connected with each other and mechanically connected with each other while keeping a prescribed interval therebetween, through the functional bumps 6 and 12. The base chip 1 and the mounted chip 2 are sealed with sealing resin 15, along with the lead frame 4 and the bonding wires 9. Part of the lead portion 10 of the lead frame 4 is exposed from the sealing resin 15, to function as an external connection section (outer lead section).

Figure 2:
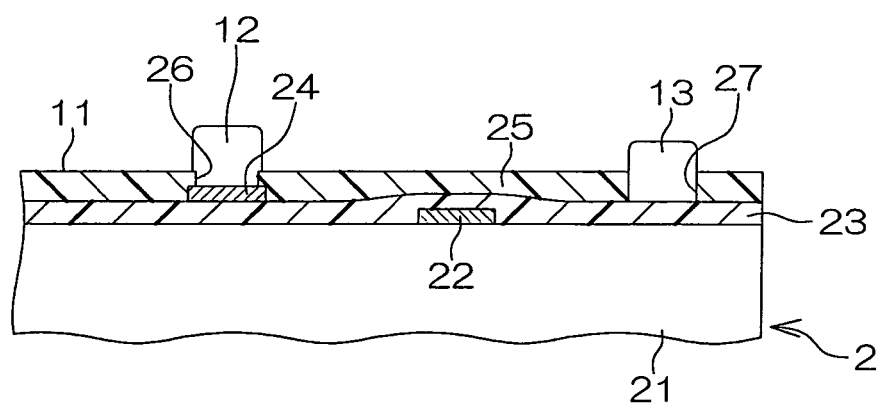
FIG. 2 A sectional view schematically showing the structure of a mounted chip.

FIG. 2 is a sectional view schematically showing the structure of the mounted chip 2.

The mounted chip 2 has a multilevel interconnection structure on a semiconductor substrate (silicon substrate, for example) 21 serving as the base thereof, for example. More specifically, the mounted chip 2 includes a wiring layer 22 electrically connected with the device built in the semiconductor substrate 21, an interlayer insulating film 23 formed on the semiconductor substrate 21 and the wiring layer 22, an electrode pad 24 arranged on the interlayer insulating film 23 and electrically connected with the wiring layer 22 through a via hole (not shown), and the surface protective film 25 formed on the interlayer insulating film 23 and the electrode pad 24 and serving as the outermost layer of the mounted chip 2 on the semiconductor substrate 21.

A pad opening 26 is formed in a position of the surface protective film 25 opposed to the electrode pad 24, and the electrode pad 24 is exposed from the surface protective film 25 through the pad opening 26. Further, a through-hole 27 penetrating the surface protective film 25 in the direction perpendicular to the surface 11 thereof is formed in the periphery of the surface protective film 25.

Each functional bump 12 is provided on the electrode pad 24 and projected from the surface protective film 25 with a predetermined projection amount (20 µm, for example) through the pad opening 26. Each connection confirmation bump 13 heaps upon the surface of the interlayer insulating film 23 facing the through-hole 27, and projected from the surface protective film 25 with another projection amount (18 µm, for example) smaller than the projection amount of the functional bump 12 through the through-hole 27. In other words, the connection confirmation bump 13 is formed lower by 1 to 5 µm (preferably 1 to 2 µm) than the functional bump 12 with reference to the surface 11 of the surface protective film 25.

According to this embodiment, all of the functional bumps 6 and 12 and the connection confirmation bumps 7 and 13 are made of the same metallic material (copper or gold, for example). In the base chip 1, all functional bumps 6 and connection confirmation bumps 7 are formed at the same height (projection amount from the surface 3 of the base chip 1).

Figure 3:
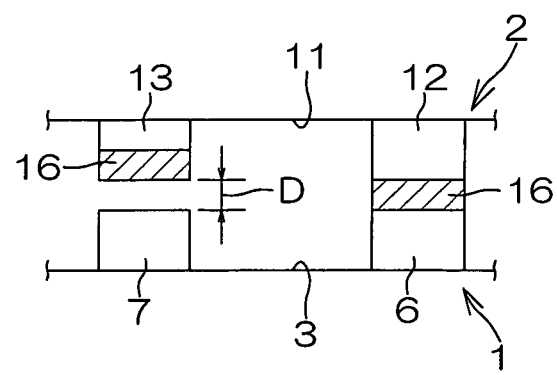
FIG. 3 Schematic diagrams of connected portions between functional bumps and connected portions between connection confirmation bumps in a base chip and the mounted chip, (a) shows a state where a solder bond provided on the tip end of the functional bump of the mounted chip is in contact with the top surface of the functional bump of the base chip, and (b) shows a state where bonding between the base chip and the mounted chip is completed.
Figure 3:
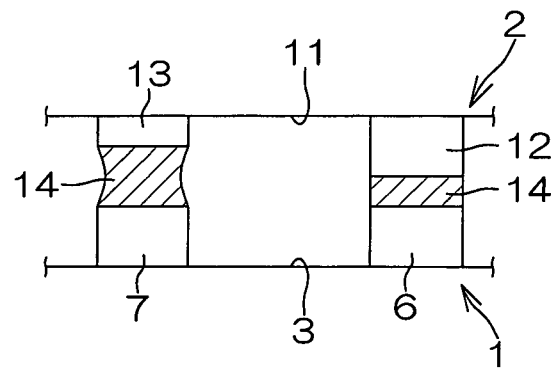

FIG. 3 is sectional views schematically showing the connected portions between the functional bumps 6 and 12 and between the connection confirmation bumps 7 and 13.

As shown in FIG. 3(a), solder bonds 16 are formed on the tip ends of each functional bump 12 and each connection confirmation bump 13 of the mounted chip 2 in the state before the base chip 1 and the mounted chip 2 are bonded to each other.

When the solder bond 16 provided on the tip end of the functional bump 12 comes into contact with the top surface of the functional bump 6 of the base chip 1 in the process of bonding between the base chip 1 and the mounted chip 2, a clearance D is formed between the solder bond 16 provided on the tip end of the connection confirmation bump 13 and the top surface of the connection confirmation bump 7 of the base chip 1 due to the difference in height between the functional bump 12 and the connection confirmation bump 13.

When the surface 3 of the base chip 1 and the surface 11 of the mounted chip 2 are parallel to each other, each clearance D between the solder bond 16 provided on the tip end of the connection confirmation bump 13 and the top surface of the connection confirmation bump 7 is equal to the interval corresponding to the difference between the heights of the functional bump 12 and the connection confirmation bump 13. When a heat treatment is thereafter performed, therefore, the solder bond 16 provided on the tip end of the connection confirmation bump 13 is melted and expanded, so that all the corresponding connection confirmation bumps 7 and 13 are connected with each other by the solder bond 16. Then, the solder bonds 16 between the functional bumps 6 and 12 opposed to each other and between the connection confirmation bumps 7 and 13 opposed to each other form the connecting metal layers 14 as shown in FIG. 3(*b*), to attain excellent connection (conduction) between these bumps.

When the surface 11 of the mounted chip 2 is inclined with respect to the surface 3 of the base chip 1, on the other hand, the interval between the surface 3 of the base chip 1 and the surface 11 of the mounted chip 2 is varied, to result in irregularity in the clearance D between the solder bond 16 provided on the tip end of the connection confirmation bump 13 and the top surface of the connection confirmation bump 7. On the portion where the surface 3 of the base chip 1 and the surface 11 of the mounted chip 2 are spaced widely, the interval of the clearance D between the solder bond 16 provided on the tip end of the connection confirmation bump 13 and the top surface of the connection confirmation bump 7 is wider than the difference between the heights of the functional bump 12 and the connection confirmation bump 13. When the volume of the solder bond 16 is at a proper constant level, therefore, the solder bond 16 does not reach the top surface of the connection confirmation bump 7 and the connection between the connection confirmation bumps 7 and 13 is not attained even if the solder bond 16 provided on the tip end of the connection confirmation bump 13 is expanded in the heat treatment on the portion where the surface 3 of the base chip 1 and the surface 11 of the mounted chip 2 are spaced widely.

Therefore, the mounted chip 2 can be determined as parallelly bonded to the base chip 1 when the connection between all connection confirmation bumps 7 and 13 is attained, while the mounted chip 2 can be determined as bonded to the base chip 1 in an inclined manner (not parallelly bonded) when the connection between any set of the connection confirmation bumps 7 and 13 is not attained.

When the connection confirmation bump 7 of the base chip 1 is formed with the same height as the functional bump 6 and the connection confirmation bump 13 of the mounted chip 2 is formed with the same height as the functional bump 12 similarly to the conventional structure, the clearance formed between the solder bond 16 provided on the tip end of the connection confirmation bump 13 and the top surface of the connection confirmation bump 7 is small on the portion where the surface 3 of the base chip 1 and the surface 11 of the mounted chip 2 are spaced widely, even if the mounted chip 2 is bonded to the base chip 1 in an inclined manner. When the solder bond 16 is melted and expanded, therefore, this solder bond 16 reaches the top surface of the connection confirmation bump 7, to undesirably attain the connection between the connection confirmation bumps 7 and 13.

According to the structure of this embodiment, on the other hand, the connection confirmation bump 13 of the mounted chip 2 is formed lower than the functional bump 12, whereby a wide clearance is formed between the solder bond 16 provided on the tip end of the connection confirmation bump 13 and the top surface of the connection confirmation bump 7 on the portion where the surface 3 of the base chip 1 and the surface 11 of the mounted chip 2 are spaced widely if the surface 11 of the mounted chip 2 is even slightly inclined with respect to the surface 3 of the base chip 1. Even if the solder bond 16 is expanded, therefore, this solder bond 16 does not reach the top surface of the connection confirmation bump 7, and the connection between the connection confirmation bumps 7 and 13 is not attained. Therefore, whether or not the mounted chip 2 is parallelly bonded to the base chip 1 can be accurately determined.

Figure 4:
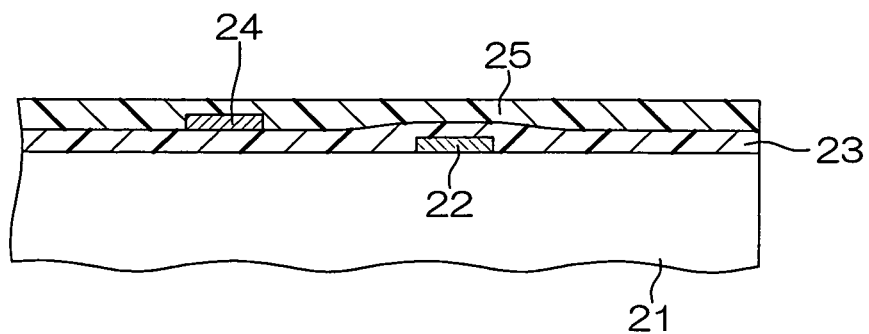
FIG. 4 Schematic sectional views showing the steps of manufacturing the mounted chip along the steps.
Figure 4:
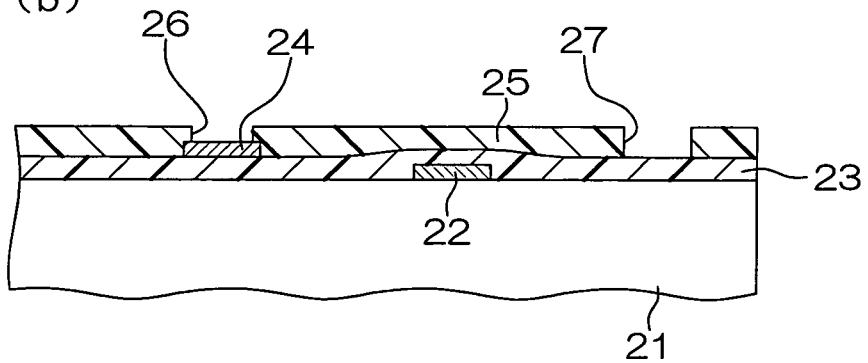
Figure 4:
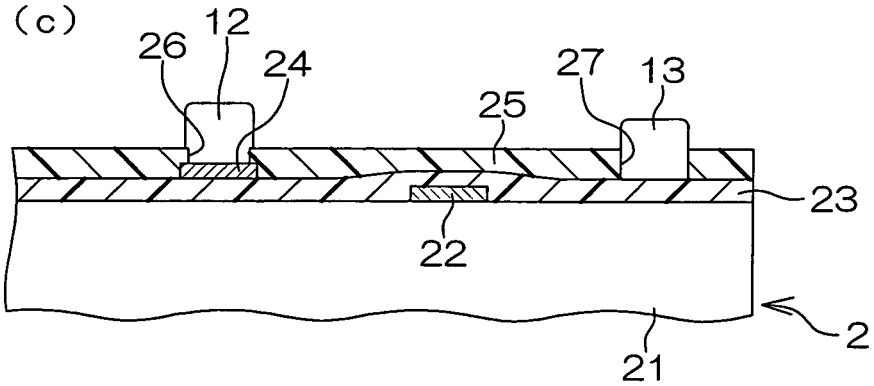

FIG. 4 is schematic sectional views showing the steps of manufacturing the mounted chip 2 in order.

First, the surface protective film 25 is formed on the entire surface of the semiconductor substrate 21 provided with the wiring layer 22, the interlayer insulating film 23 and the electrode pad 24 by depositing silicon nitride or silicon oxide, for example, as shown in FIG. 4(*a*). Silicon nitride or silicon oxide can be deposited by CVD.

Then, the pad opening 26 and the through-hole 27 are penetratingly formed in the surface protective film 25 by a photolithographic step, as shown in FIG. 4(*b*).

Thereafter the metallic material is deposited in the pad opening 26 and the through-hole 27 by selective plating, thereby forming the functional bump 12 and the connection confirmation bump 13, as shown in FIG. 4(*c*). The vertical positions of the bottom surface of the pad opening 26 (the surface of the electrode pad 24) and the bottom surface of the through-hole 27 (the surface of the interlayer insulating film 23) are different from each other, whereby the functional bump 12 and the connection confirmation bump 13 having different heights (projection amounts) with respect to the surface of the surface protective film 25 can be obtained without requiring specific steps, by forming the functional bump 12 and the connection confirmation bump 13 in the same step.

The present invention is not restricted to this but the functional bump 12 and the connection confirmation bump 13 may alternatively be formed through different steps respectively. In other words, one of the functional bump 12 and the connection confirmation bump 13 may be formed first, and the other one may be subsequently formed.

FIG. 5 is a schematic sectional view showing another structure of the mounted chip 2. Referring to FIG. 5, portions corresponding to the respective portions shown in FIG. 2 are denoted by the same reference numerals as those in FIG. 2. In the following, only the points different from the mounted chip 2 having the structure shown in FIG. 2 are described, and detailed description of the respective portions is omitted.

In this mounted chip 2 shown in FIG. 5, a communicating hole 28 communicating with a through-hole 27 of a surface protective film 25 is penetratingly formed in an interlayer insulating film 23. A connection confirmation bump 13 heaps up on the surface of a semiconductor substrate 21, and projected from the surface protective film 25 through the through-hole 27 with a projection amount (15 μm, for example) smaller than the projection amount of a functional bump 12.

Effects similar to those of the structure shown in FIG. 2 can be attained also according to this structure.

While the embodiment of the present invention has been described, the present invention can also be carried out in another mode. For example, while the connection confirmation bump 13 is formed lower than the functional bump 12 in the mounted chip 2 in the aforementioned embodiment, the connection confirmation bump 7 may be formed lower than the functional bump 6 also in the base chip 1, as shown in FIG. 6. In this case, preferably the connection confirmation bumps 7 and 13 are formed respectively on such heights that a clearance D of 1 to 5 µm (preferably, 1 to 2 µm) is formed between the solder bond 16 provided on the tip end of the connection confirmation bump 13 and the top surface of the connection confirmation bump 7 of the base chip 1 when the solder bond 16 provided on the tip end of the functional bump 12 comes into contact with the top surface of the functional bump 6 of the base chip 1 in the process of bonding between the base chip 1 and the mounted chip 2, as shown in FIG. 6(a). When the bumps are formed in this manner, the solder bonds 16 between the functional bumps 6 and 12 opposed to each other and between the connection confirmation bumps 7 and 13 opposed to each other form the connecting metal layers 14 to attain excellent connection therebetween if the surface 3 of the base chip 1 and the surface 11 of the mounted chip 2 are parallel to each other, as shown in FIG. 6(b).

Further, the functional bump 12 and the connection confirmation bump 13 may be formed with the same height in the mounted chip 2, and the connection confirmation bump 7 may be formed lower than the functional bump 6 in the base chip 1. In other words, while the base chip 1 and the mounted chip 2 are regarded as the first semiconductor chip and the second semiconductor chip respectively in this embodiment, the base chip 1 may be regarded as the second semiconductor chip, and the mounted chip 2 may be regarded as the first semiconductor chip.

Figure 7:
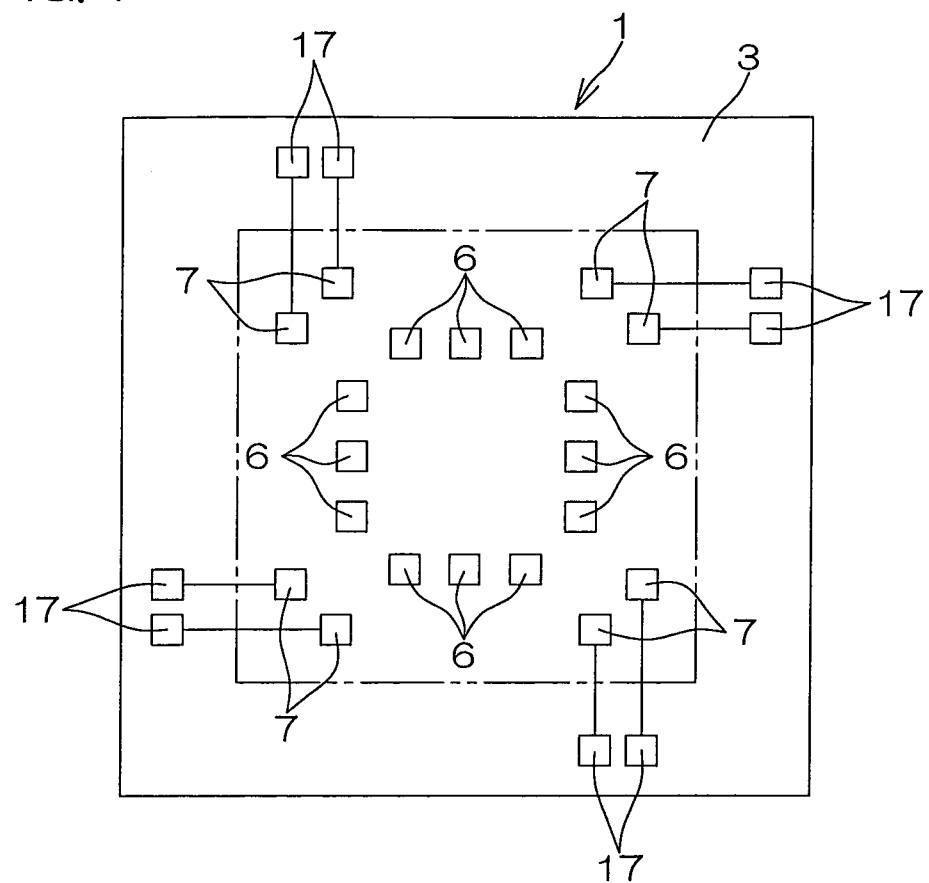
FIG. 7 A schematic plan view showing such a structure that the connection confirmation bump is electrically cut off from inner circuits of the base chip and the mounted chip.
Figure 7:
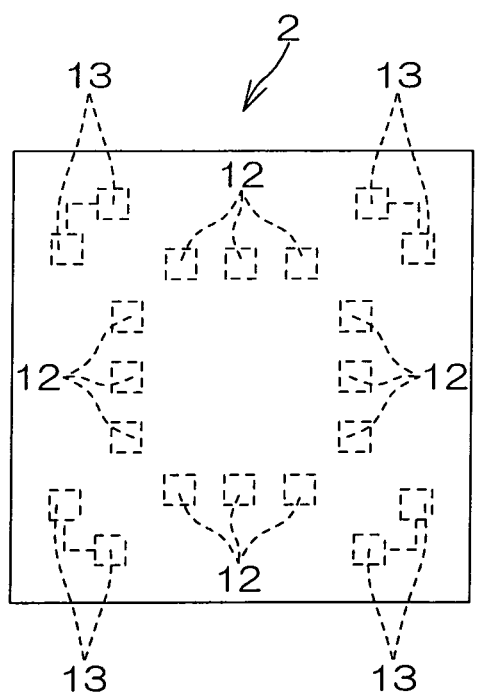

In addition, the connection confirmation bumps 7 and 13 may be connected with internal circuits of the base chip 1 and the mounted chip 2 respectively, or may be electrically cut off from the internal circuits of the base chip 1 and the mounted chip 2 respectively. When the connection confirmation bumps 7 and 13 are cut off from the internal circuits, a set of two connection confirmation bumps 7 are arranged on each corner of the chip bonding region while external extraction electrodes 17 electrically connected with the respective connection confirmation bumps 7 are provided outside the chip bonding region in the base chip 1, as shown in FIG. 7. In the mounted chip 2, on the other hand, a set of two connection confirmation bumps 13 are arranged on each corner, and the set of two connection confirmation bumps 13 are electrically connected with each other. When the base chip 1 and the mounted chip 2 are parallelly bonded to each other, therefore, each set of connection confirmation bumps 7 and 13 are connected with each other and the external extraction electrodes 17 in each set are short-circuited, whereby electrical resistance therebetween is reduced. When the mounted chip 2 is bonded to the base chip 1 in an inclined manner, on the other hand, the connection between the connection confirmation bumps 7 and 13 is not attained in the portion where the surfaces of the chips are spaced widely and the electrical conduction between the external extraction electrodes 17 is not attained, whereby the electrical resistance therebetween is increased. Therefore, whether or not the mounted chip 2 is parallelly bonded to the base chip 1 can be accurately determined on the basis of results of measurement of the electrical resistance between each set of external extraction electrodes 17.

While the semiconductor device of the chip-on-chip structure has been described, the present invention may also be applied to a semiconductor device having a flip chip bonding structure obtained by opposing and bonding the surface of a semiconductor chip to a wiring board (solid-state device).

Besides, various modifications may be made within the scope of the appended claims. It should be understood that the embodiments described above are merely illustrative of the technical principles of the present invention but not limitative of the invention. The spirit and scope of the present invention are to be limited only by the appended claims.

This application corresponds to Japanese Patent Application No. 2005-241520 and Japanese Patent Application No. 2005-241521 filed with the Japanese Patent Office on Aug. 23, 2005, the disclosures of which are incorporated herein by reference.

What is claimed is:

1. A semiconductor chip to be bonded to a bonding object in a state of opposing a surface of the semiconductor chip to the bonding object, comprising:
 a first functional bump projected from the surface with a first projection amount, the first functional bump for establishing an electrical connection to electrically connect the semiconductor chip with the bonding object;
 a first connection confirmation bump projected from the surface with a second projection amount smaller than the first projection amount, the first connection confirmation bump used for confirming a state of the electrical connection established by the first functional bump;
 a semiconductor substrate;
 a surface protective film covering a surface of the semiconductor substrate; and
 an electrode pad interposed between the semiconductor substrate and the surface protective film and arranged to face a pad opening formed in the surface protective film, wherein
 the first functional bump is provided on the electrode pad so that the first projection amount projects from the surface protective film through the pad opening, and
 the first connection confirmation bump heaps up on a heap position which is closer to the semiconductor substrate than a position of the electrode pad, and the second projection amount projects from the surface protective film through a through-hole penetrating the surface protective film, and
 the bonding object includes
 a second functional bump projected from a surface of the bonding object with a third projection amount, the second functional bump for establishing an electrical connection to electrically connect the bonding object with the semiconductor chip, and
 a second connection confirmation bump projected from the surface of the bonding object with a fourth projection amount smaller than the third projection amount, the second connection confirmation bump used for confirming a state of the electrical connection established by the second functional bump.

2. The semiconductor chip according to claim 1, further comprising an interlayer film which is interposed between the semiconductor substrate and the surface protective film and in which the electrode pad is arranged on a surface of the interlayer film, wherein the first connection confirmation bump heaps up on the surface of the interlayer film.

3. The semiconductor chip according to claim 1, wherein the first connection confirmation bump heaps up on the surface of the semiconductor substrate.

4. The semiconductor chip according to claim 1, further comprising an internal circuit, wherein the first connection confirmation bump is electrically disconnected from the internal circuit.

5. The semiconductor chip according to claim 1, wherein the first functional bump and the first connection confirmation bump are made of the same metallic material.

6. The semiconductor chip according to claim 1, further comprising connecting metal layers provided on tip ends of the first functional bump and the first connection confirmation bump.

7. The semiconductor chip according to claim 6, wherein the first functional bump and the first connection confirmation bump are made of copper or gold, and the connecting metal layers are made of solder bonds.

8. The semiconductor chip according to claim 1, wherein the second projection amount is 1~5 μm smaller than the first projection amount.

9. The semiconductor chip according to claim 1, wherein
the semiconductor chip has a generally rectangular shape when the surface thereof is vertically viewed,
the first functional bump is arranged at a center of the surface of the semiconductor chip, and
the first connection confirmation bump includes a plurality of first connection confirmation bumps that are arranged on each corner of the surface of the semiconductor chip.

10. The semiconductor chip according to claim 9, wherein a pair of the first connection confirmation bumps are arranged on each corner of the surface of the semiconductor chip.

11. The semiconductor chip according to claim 10, wherein for each pair of the first connection confirmation bumps, the respective first connection confirmation bumps are electrically connected to each other.

12. The semiconductor chip according to claim 1, wherein the bonding object includes a solid-state device.

13. The semiconductor chip according to claim 1, wherein the first connection confirmation bump touches the heap position.

14. The semiconductor chip according to claim 13, wherein the first functional bump touches the electrode pad.

15. The semiconductor chip according to claim 1, wherein the electrical connection established by the first functional bump and the electrical connection established by the second functional bump are an electrical connection between the first functional bump and second functional bump,
further wherein the first connection confirmation bump is electrically connected to the second connection confirmation bump so as to confirm whether the first functional bump is electrically connected to the second functional bump.

16. A semiconductor device comprising:
a semiconductor chip having a first terminal and a second terminal each formed on a surface of the semiconductor chip; and
a solid-state device mounted to the surface, the solid-state device having a third terminal and a fourth terminal each formed on a surface of the solid-state device, the surface of the solid-state device being disposed opposite the surface of the semiconductor chip,
the first and third terminals being connected to each other,
the second and fourth terminals being connected to each other, and
a length of the second terminal being shorter than that of the first terminal, and
a length of the fourth terminal being shorter than that of the third terminal.

17. The semiconductor device of claim 16, wherein the semiconductor chip comprises solder bonds,
a first of the solder bonds touching each the first terminal and the third terminal to electrically connect the first and third terminals together,
a second of the solder bonds touching each of the second terminal and the fourth terminal to electrically connect the second and fourth terminals together.

18. A device comprising:
a semiconductor chip including
a semiconductor surface,
a chip functional bump on the semiconductor surface, the chip functional bump having an end surface disposed a first distance from the semiconductor surface and being further from the semiconductor surface than any other surface of the chip functional bump,
a chip connection confirmation bump on the semiconductor surface, the chip connection confirmation bump having an end surface disposed a second distance from the semiconductor surface and being further from the semiconductor surface than any other surface of the chip connection confirmation bump, the second distance being smaller than the first distance; and
a bonding object bonded to the semiconductor chip, the bonding object including
a bonding object surface that faces the semiconductor surface,
a bonding object functional bump on the bonding object surface, the bonding object functional bump having an end surface disposed a third distance from the bonding object surface and being further from the bonding object surface than any other surface of the bonding object functional bump, and
a bonding object connection confirmation bump on the bonding object surface, the bonding object connection confirmation bump having an end surface disposed a fourth distance from the bonding object surface and being further from the bonding object surface than any other surface of the bonding object connection confirmation bump, the fourth distance being smaller than the third distance.

19. The device of claim 18, wherein the bonding object is a solid-state device.

20. The device of claim 18, further comprising solder bonds,
a first of the solder bonds touching each the chip functional bump and the bonding object functional bump to form an electrical connection therebetween, and
a second of the solder bonds touching each of the chip connection confirmation bump and the bonding object connection confirmation bump to form an electrical connection therebetween.

21. The device of claim 18, wherein
the first distance is measured along a straight line perpendicular to the semiconductor surface,
the second distance is each measured along another straight line perpendicular to the semiconductor surface, and
the third distance is measured along a straight line perpendicular to the bonding object surface, and
the fourth distance is measured along another straight line perpendicular to the bonding object surface.

22. The device of claim 18, wherein the chip functional bump and chip connection confirmation bump each touch the semiconductor surface,
further wherein the bonding object functional bump and the bonding object connection confirmation bump each touch the bonding object surface.

23. The device of claim 18, wherein the chip functional bump and the bonding object functional bump are for forming an electrical connection between the semiconductor chip and the bonding object, the chip connection confirmation bump and the bonding object connection confirmation bump are connectable together so as to determine whether the chip functional bump and the bonding object functional bump form the electrical connection.

* * * * *